United States Patent
Cheung et al.

(10) Patent No.: US 6,492,722 B1
(45) Date of Patent: Dec. 10, 2002

(54) METALLIZED INTERCONNECTION STRUCTURE

(75) Inventors: Robin W. Cheung, Cupertino; Chiu H. Ting, Saratoga, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 7 days.

(21) Appl. No.: 09/707,831

(22) Filed: Nov. 8, 2000

Related U.S. Application Data

(62) Division of application No. 09/090,380, filed on Jun. 4, 1998, now Pat. No. 6,153,521.

(51) Int. Cl.[7] ............................................. H01L 23/12
(52) U.S. Cl. ...................................... 257/700; 257/750
(58) Field of Search ............................. 257/700, 701, 257/748, 750, 758

(56) References Cited

U.S. PATENT DOCUMENTS

| | | |
|---|---|---|
| 5,151,168 A | 9/1992 | Gilton et al. |
| 5,256,274 A | 10/1993 | Prois |
| 5,266,446 A | 11/1993 | Chang et al. |
| 5,300,813 A | 4/1994 | Joshi et al. |
| 5,334,488 A | 8/1994 | Shipley, Jr. |
| 5,482,894 A | 1/1996 | Havemann |
| 5,550,405 A | 8/1996 | Cheung et al. |
| 5,635,423 A | 6/1997 | Huang et al. |
| 5,705,430 A | 1/1998 | Avanzino et al. |
| 5,821,620 A | 10/1998 | Hong |
| 5,830,563 A | * 11/1998 | Shimoto et al. ............ 428/209 |

OTHER PUBLICATIONS

"Low Cost Additive Electroless Copper Metallization on BCB for MCm–D" by Toepper et al., Micro System Technologies, pp. 199–203.

"MCM–D/L Using Copper/Photosensitive BCB Multilayer for Upper Microwave Band Systems" by Miyagi et al., IEEE, pp. 149–153.

"Selective Electroless Copper for VLSI Interconnection" by Pai et al., IEEE, pp. 423–425.

"Cu/Photosensitive–BCB Thin Film Multilayer Technology for High–Performance Multichip Module" by Shimoto et al., MCM, pp. 115–120.

* cited by examiner

Primary Examiner—Roy Potter

(57) ABSTRACT

A dual damascene method of fabricating an interconnection level of conductive lines and connecting vias etches a via opening in a first insulating layer. A photoresist layer that the defines the conductive wiring is deposited and patterned on the first insulating layer after the via opening has been created. The via opening and the conductive wire opening in the resist layer are then filled with the conductive material, such as copper. The resist layer may then be removed and a second insulating layer provided over the first insulating layer.

20 Claims, 5 Drawing Sheets

METALLIZED INTERCONNECTION STRUCTURE

This application is a Divisional of application Ser. No. 09/090,380 filed Jun. 4, 1998 now U.S. Pat. No 6,153,521.

FIELD OF THE INVENTION

The present invention relates to the field of semiconductor device manufacturing, and more particularly, to the process of providing interconnection structures that interconnect integrated circuits in semiconductor devices.

BACKGROUND OF THE INVENTION

In very and ultra large scale integration (VLSI and ULSI) circuits, insulating or dielectric material, such as silicon dioxide, of the semiconductor device is patterned with several thousand openings for the conductive lines and vias which are filled with conductive material, such as metal, and serve to interconnect the active and/or passive elements of the integrated circuit. The interconnection process is used for forming the multi-level signal lines of metal, such as a copper, in an insulating layer, such as polyimide, of a multi-layer substrate in which the semiconductor devices are mounted.

Damascene is an interconnection fabrication process in which grooves are formed in an insulating layer and filled with metal to form the conductive lines. Dual damascene is a multi-level interconnection process in which, in addition to forming the grooves of single damascene, the conductive via openings are also formed. In the standard dual damascene process, the insulating layer is coated with a resist material which is exposed to a first mask with the image pattern of the via openings and the pattern is anisotropically etched in the upper half of the insulating layer. After removal of the patterned resist material, the insulating layer is coated with a resist material which is exposed to a second mask with the image pattern of the conductive lines in alignment with the via openings. During anisotropic etching of the openings for the conductive lines in the upper half of the insulating material, the via openings already present in the upper half are simultaneously etched in the lower half of the insulating material. After the etching is complete, both the vias and the grooves are filled with metal. The excess metal was removed by CMP (chemical mechanical polishing) techniques. One of the advantages of dual damascene processing is that it permits the filling of both the conductive grooves and the vias with metal at the same time, thereby eliminating process steps. Furthermore, with single damascene, since two different metal deposition steps were used, an interface exists between the conductive via and the conductive wiring.

One dual damascene method described in U.S. Pat. No. 5,705,430 uses a sacrificial via fill. In this method, a first layer of insulating material is formed with via openings. The openings are filled with a sacrificial removable material. A second layer of insulating material is disposed on the first layer. Using a conductive line pattern, aligned with the via openings, conductive line openings are etched in the second insulating layer and, during etching, the sacrificial fill is removed from the via openings. The sacrificial material is not etchable by the etchant performing the conductive line openings and, after formation of the conductive line openings, the sacrificial material is removed with an etchant to which a first insulating layer is resistive or less selective. Conductive material is then deposited in the conductive line and the via openings.

U.S. Pat. No. 5,635,423 describes a simplified dual damascene process for multilevel metallization and interconnection structure. An opening for a via is initially formed in a second insulative layer above a first insulative layer with an etch stop layer therebetween. A larger opening for a trench is then formed in the second insulative layer while simultaneously extending the via opening through the etch stop layer and the first insulative layer. The trench and the via are then simultaneously filled with conductive material. Alternatively, the via is defined on the etch-stop layer. The resist layer is then deposited and masked for the trenches. The large opening for the trench and the smaller opening for the via are simultaneously etched. The trench and the via are then simultaneously filled with conductive material.

Although both of the above described processes provide the desired dual damascene structure, there is a continuing goal of simplifying the process even further and thereby making it less expensive.

SUMMARY OF THE INVENTION

There is a need for a dual damascene process that is less complicated than known dual damascene processes, yet still attains the desired dual damascene structure without an interface between the via and the conductive wiring. There is also a need for a method of producing a metal structure without using CMP techniques.

These and other means are met by embodiments of the present invention which provide a method of forming a conductive wiring and a via in which a via opening is formed in a first insulating layer. A conductive wiring mask layer is deposited and patterned over the first insulating layer so that an opening in the conductive wiring mask layer is provided over the via opening. Conductive material is then deposited in the via opening and in the conductive wiring mask layer opening to form the conductive wiring in the via.

Since the conductive wiring mask layer is used in the present invention to receive the deposited conductive material to form the conductive wiring, a separate step of etching of insulating material to form a conductive wiring opening is unnecessary. This greatly reduces the overall etching requirements and costs of manufacture.

In certain embodiments of the invention, the conductive wiring mask layer is removed after the depositing of the conductive material in the via opening and the conductive wire mask layer opening. A second insulating layer, comprising benzocyclobutene (BCB), for example, is deposited over the first insulating layer and the conductive wiring. Hence, certain embodiments of the present invention provide the same dual damascene structure as in the known processes, with a via formed within a first insulating layer, and conductive wiring within a second insulating layer. This is accomplished, however, without etching of the second insulating layer.

The earlier stated needs are also met by other embodiments of the present invention which provide a method of forming a layered conductive structure in a semiconductor device comprising the steps of forming an opening in a first insulating layer and patterning a resist layer on the first insulating layer. A space is defined in the resist layer that is located over the opening. The opening in the first insulating layer and the space in the resist layer are simultaneously filled with conductive material to form the layered conductive structure.

The present invention provides the advantage of forming integral layered structures without etching a second layer. This has significant cost advantages over methods which employ etching of the second layer, while still providing conductive structures that are integrally formed. Hence, the completed layered conductive structure will not have an interface between the conductive material of the first and second layers. This embodiment is not restricted to conductive vias and wiring, but rather may be used to create other forms of layered conductive structures.

The present invention also provides, in certain embodiments, an article comprising a first insulating layer with a conductive structure in the first insulating layer. A photoresist layer is provided over the first insulating layer, with an opening in the photoresist layer that is disposed over the conductive structure. Conductive wiring fills the opening in the photoresist layer and contacts the conductive structure. In conventional articles, conductive structure is provided in a first insulating layer which has been etched, and the conductive wiring that contacts the conductive structure is provided in a second insulating layer that has been likewise etched. The present invention has the advantage of avoiding the etching of the second insulating layer and instead providing a conductive wiring in a photoresist layer. The article of the present invention may be used to provide interconnections by further processing of the article, including removing the photoresist layer and depositing a second insulating layer over the first insulating layer and the conductive wiring.

An advantage of the present invention is that it eliminates the requirement of CMP removal of excess metal during the filling process.

The foregoing and other features, aspects and advantages of the present invention will become apparent from the following detailed description of the present invention when taken in conjunction with the accompanying drawings.

DETAILED DESCRIPTION OF THE INVENTION

The present invention provides a layered conductive structure in which the conductive material in the different layers are integrally formed to avoid creation of an interface between the conductive material in the different layers. As will be understood from the following description, the structure is achieved without etching of a second insulating layer.

Figure 1:
FIG. 1 is a cross-section of a global diffusion barrier layer with an underlying substrate structure.

FIG. 1 schematically depicts a global diffusion layer 32 that has been deposited on an underlying substrate 30. The substrate 30 may be underlying metal structure, for example, or a conventional semiconductor substrate material, such as silicon.

The global diffusion barrier layer is employed to prevent diffusion of the conductive material into the substrate 30 that can cause electrical shorts. This especially important when copper is used as the conductive material since copper is difficult to delineate and normally must be cladded with a barrier. An example of a suitable material for the barrier layer is silicon nitride (SiN).

Figure 2:
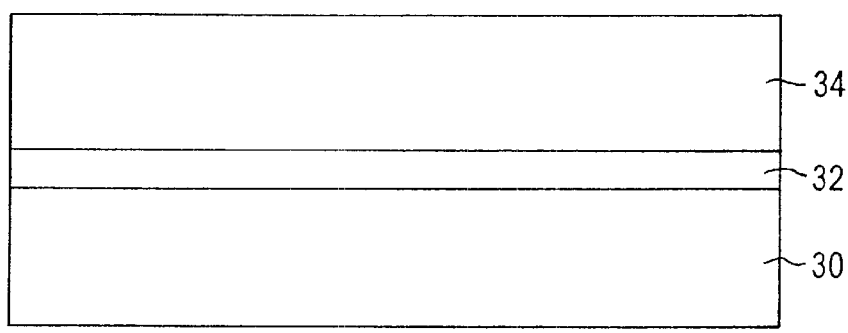
FIG. 2 is a cross-section of the structure of FIG. 1 following coating of a first insulating layer on the barrier layer.

In FIG. 2, a first insulating layer has been provided on the global diffusion barrier layer 32. In certain preferred embodiments, the first insulating layer is composed of the dielectric material benzocyclobutene (BCB). The first insulating layer can be made of an oxide material, as in alternate embodiments, such as silicon dioxide. However, an advantage of using benzocyclobutene as the first insulating layer is that it acts as a self-copper diffusion barrier. In other words, no other diffusion barrier is needed to prevent copper from diffusing into the insulating material in the insulating layer 34. The dielectric material may be spin coated on to the barrier layer 32.

After the first insulating layer 34 has been applied, an etch stop layer 36 is deposited over the first insulating layer 34. The etch stop layer 36 may be composed of any of a number of different materials such as silicon nitride (SiN) or chemically vapor deposited (CVD) oxide.

Figure 3:
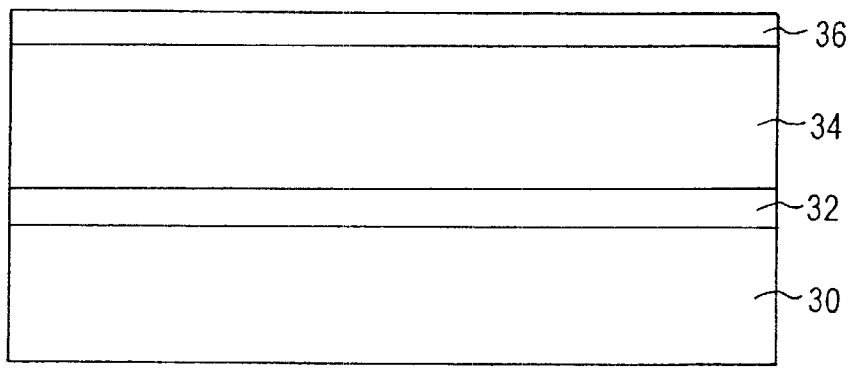
FIG. 3 is a cross-section of the structure of FIG. 2 following deposition of an etch stop layer on the first insulating layer.
Figure 4:
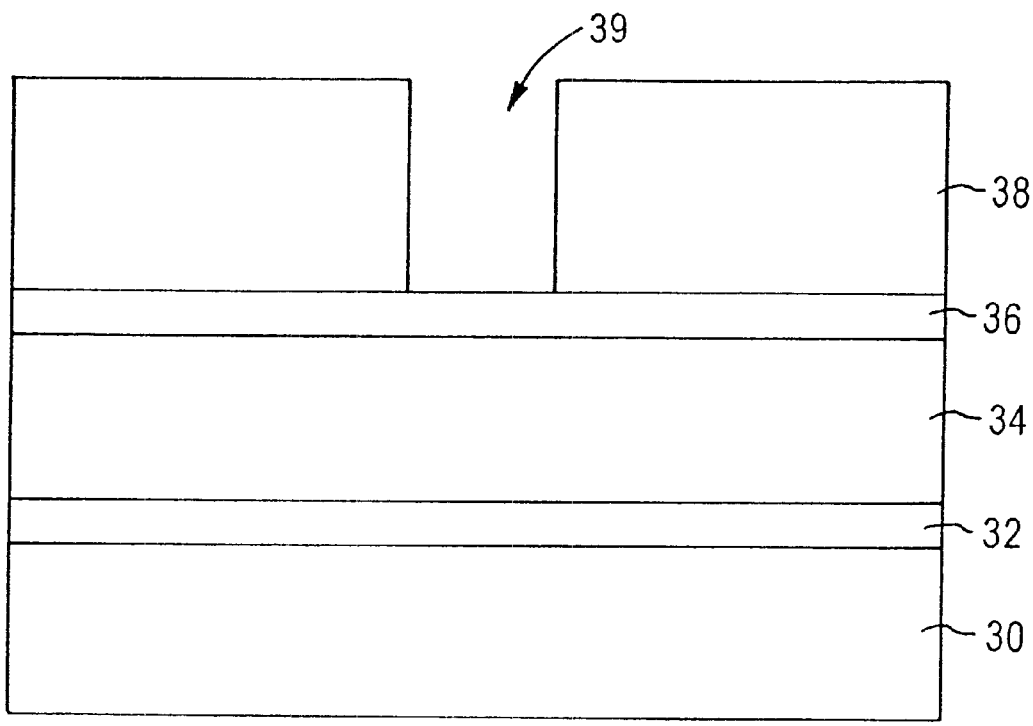
FIG. 4 is a cross-section of the structure of FIG. 3 following deposition of a photoresist layer and patterning a mask in the photoresist layer.

FIG. 4 depicts the structure of FIG. 3 after a photoresist layer 38 has been deposited and patterned. The patterning of the resist layer 38 produces openings 39 which will define the openings that will be created in the first insulating layer 34. In the exemplary embodiment, the openings to be created in the first insulating layer 34 are via openings in which conductive material is filled to create conductive vias.

Figure 5:
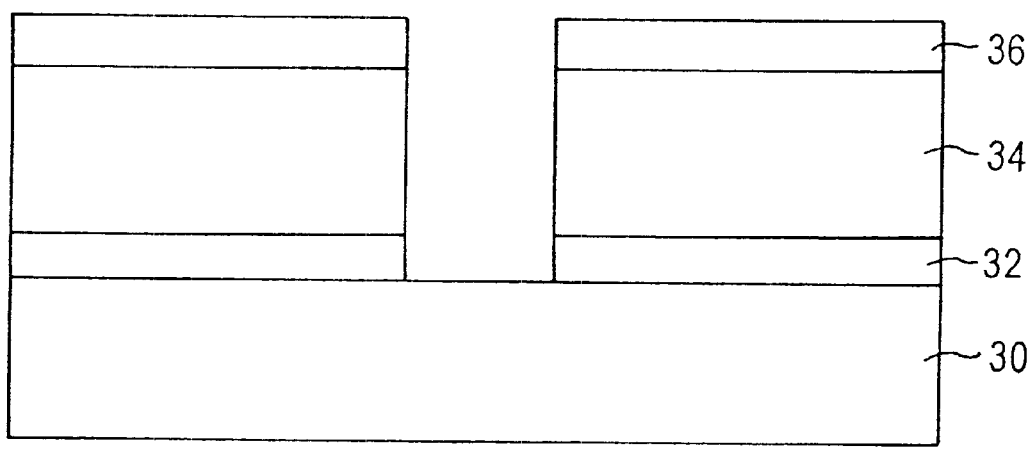
FIG. 5 is a cross-section of the structure of FIG. 4 following an etching process.

An etching step is now performed, the results of which are depicted in FIG. 5, using the opening 39 in the mask layer 38 as a guide. Anisotropic etching is performed that etches through the etch stop layer 36, the first insulating layer 34 and the barrier layer 32. At the same time, the photoresist in the resist layer 38 is removed. In other words, the etching process has a 1:1 selectivity such that when the etching of the first insulating layer 34 is completed, all of the resist material in the resist layer 38 is removed.

The anisotropic etching may be a plasma etching or reactive ion etching (RIE). When the first insulating layer is composed of benzocyclobutene, as in certain preferred embodiments, an oxygen plasma may be employed since benezocyclobutene is an organic-based material sensitive to oxygen plasma.

Figure 6:
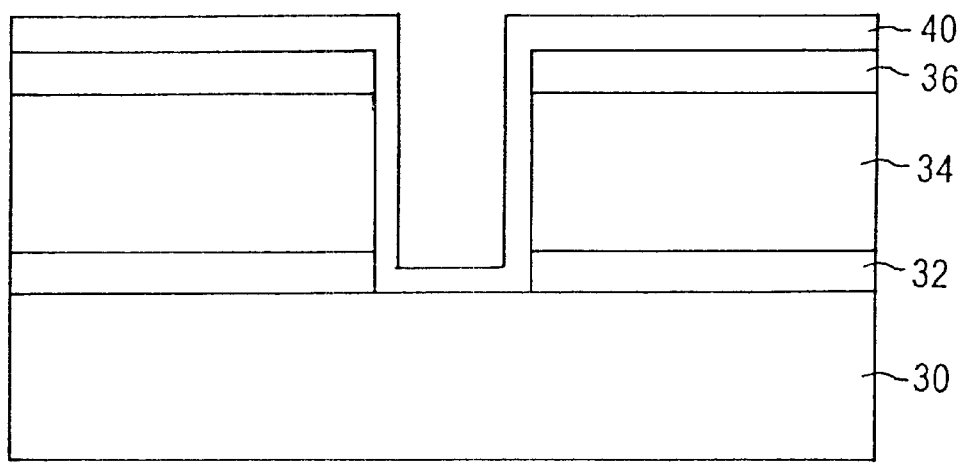
FIG. 6 is a cross-section of the structure of FIG. 5 following deposition of a seed layer.

The etching creates a via opening that is subsequently covered by a seed layer 40 as depicted in FIG. 6. The seed layer 40 is typically a sandwiched layer of a refractory metal or refractory metal nitride layer, i.e. Ta, TaN, TiN, W, WN, etc. and a copper deposition seed layer. For the seed layer, any electrically conductive material may be used that is capable of promoting subsequent selective deposition and/or growth of a conductive material compound thereon which is capable of such deposition and/or growth. The term "selective" means that the subsequently formed selective conducting metal compound would be deposited and/or grown only over the seed material and not on the exposed surfaces not covered with this seed material. In certain preferred embodiments, the seed material is a copper alloy, such as 1% Al—Cu, 1% Mg—Cu, 1% Sn—Cu, etc. These copper alloys form a self passivating layer on all of the exposed surfaces of a copper interconnect when provided with appropriate heat treatment. Alternatively, pure copper can be used as a seed layer. However, pure copper has the disadvantage that it will not act as a self passivating layer.

Figure 7:
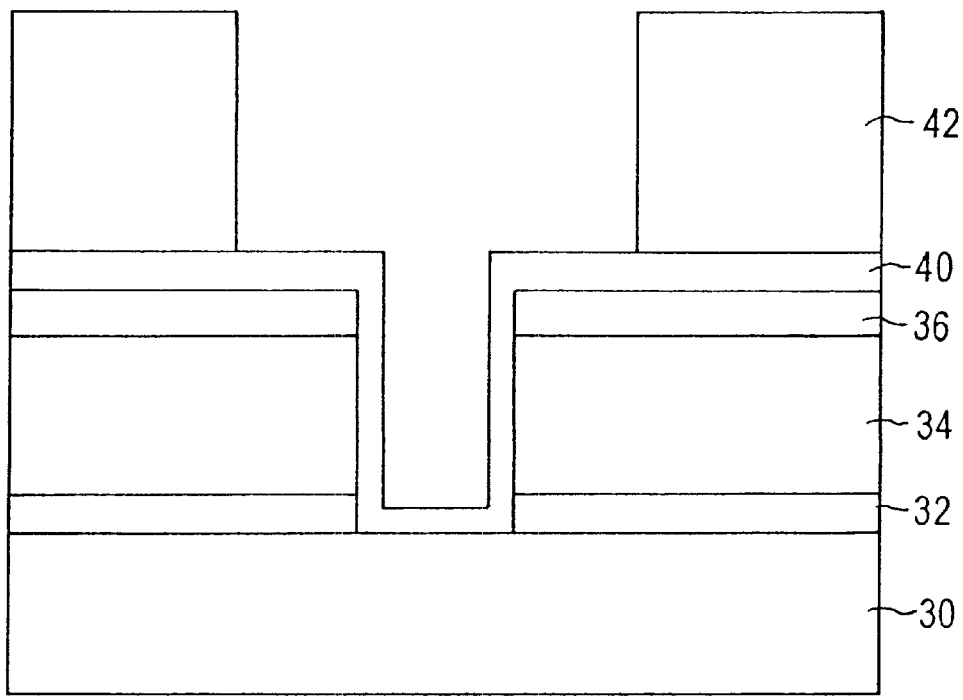
FIG. 7 is a cross-section of the structure of FIG. 6 following deposition and patterning of photoresist to form the interconnect mask.

FIG. 7 depicts the structure of FIG. 6 after a second resist mask has been deposited and patterned as resist layer 42. This layer 42 may also be termed the "conductive wiring mask layer" since the patterns define conductive wiring in preferred embodiments when the conductive material fills the opening in this layer 42.

Figure 8:
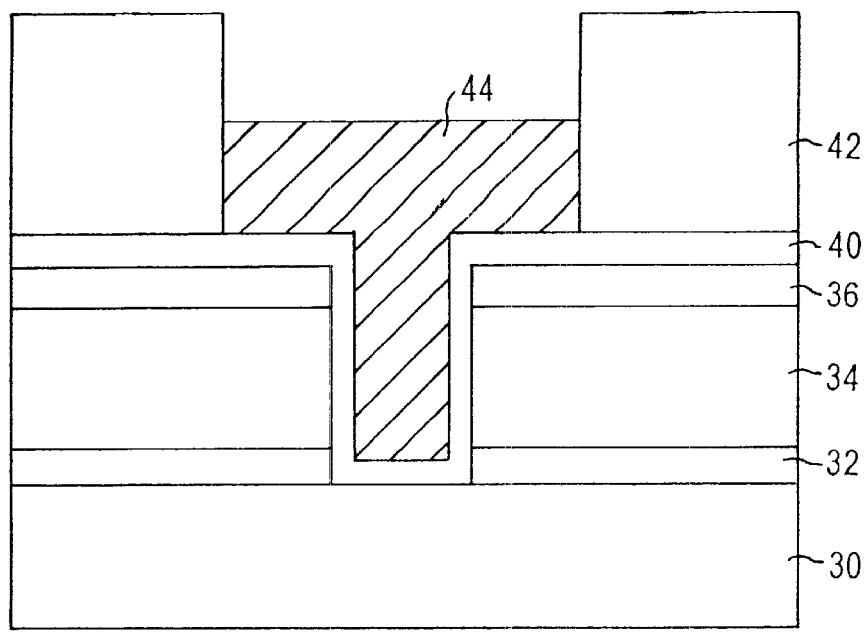
FIG. 8 is a cross-section of the structure of FIG. 7 after conductive material has been deposited.

With the conductive wiring defined by the mask layer 42, the via opening and the opening in the conductive wiring mask layer 42 are simultaneously or concurrently filled with copper, for example, in certain preferred embodiments. The deposition of the conductive material may be performed by a number of different methodologies, such as electroless deposition, selective chemical vapor deposition (CVD) and electroplating. If electroplating of copper is performed, as in certain preferred embodiments of the invention, a fountain-type hardware may be used, and the back-side and bevel wafer are excluded from electrolyte flow. The current is carried by an electrode which contacts the front side of the wafer so that it is in contact with the copper alloy seed layer 40. The plating continues for a specified project time. That provides the appropriate thickness (height) of the copper. The plating bath is acidic, and is not basic as in the electroplating process described in U.S. Pat. No. 5,151,168. Furthermore, the substrate 30 is not immersed into a plating bath as also provided in U.S. Pat. No. 5,151,168. The structure formed after the filling of the via opening and the conductive wiring mask layer opening is depicted in FIG. 8. The conductive material is indicated by reference numeral 44. One of the advantages provided by the simultaneous filling of the via opening and the conductive wiring mask layer opening is that there is no interface between the conductive via and the conductive wiring. Rather, they are integrally formed.

Figure 9:
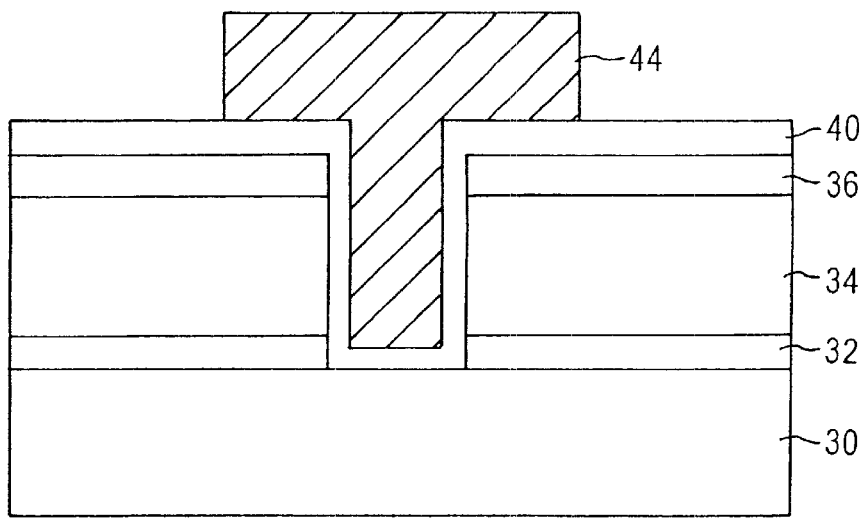
FIG. 9 is a cross-section of the structure of FIG. 8 after the photoresist layer has been removed.
Figure 10:
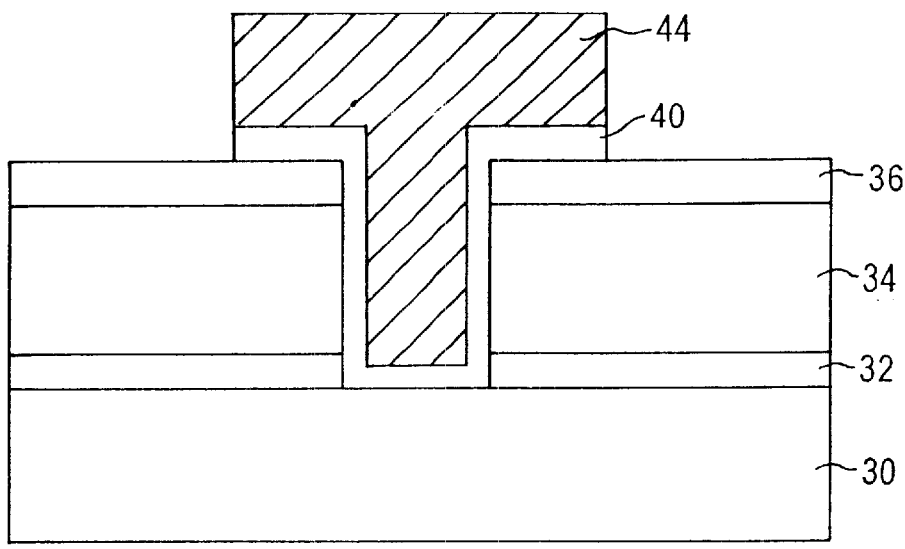
FIG. 10 is a cross-section of the structure of FIG. 9 following etching of exposed areas of the seed layer.
Figure 11:
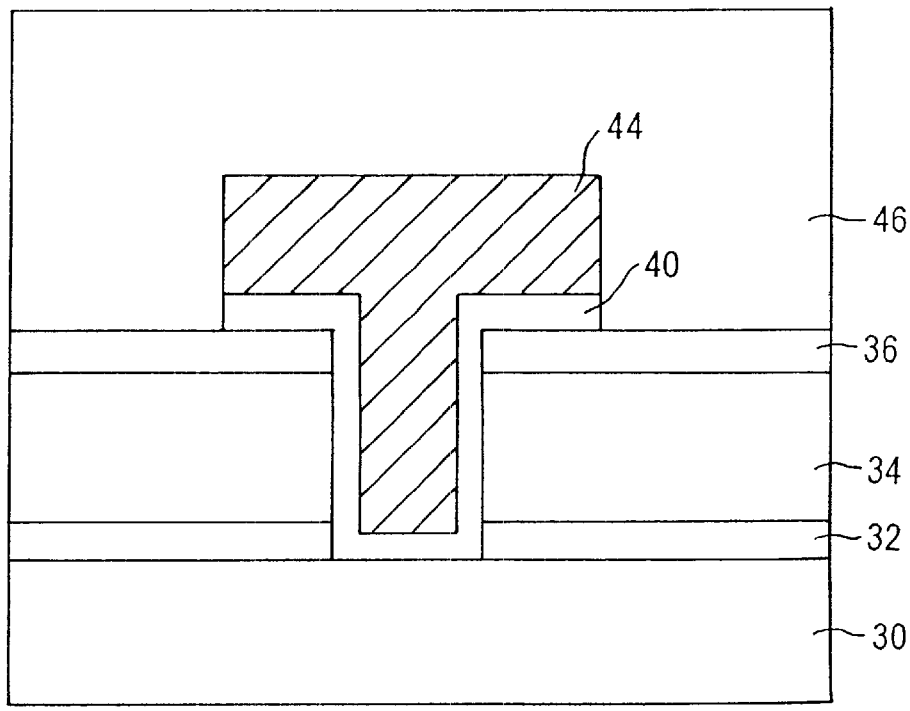
FIG. 11 is a cross-section of the structure of FIG. 10 after a second insulating layer has been deposited.

The conductive wiring mask layer 42 is removed by an appropriate process, either a wet or dry process. A cross-section of the structure following the removal of layer 42 is depicted in FIG. 9. At this point, a portion of the seed layer 40 is exposed, and the seed layer 40 is etched by a conventional technique, either by dry etching or wet etching or by electropolishing. This etching is a blanket etch back, as equal amounts of copper are removed from the substrate surface until the exposed copper seed layer 40 is removed. The structure formed after the seed layer 40 has been etched back has been depicted in FIG. 10.

Following the etching back of the seed layer 40, a second insulating layer 46 is provided over the etch stop layer 36. In certain preferred embodiments, the second insulating layer 46 is benzocyclobutene, a dielectric material, and may be applied by spin-coating. Preferred characteristics of the second insulating layer include the ability to gap fill, and form a self-copper diffusion barrier. For these reasons, benzocyclobutene is an especially suitable material.

The steps described above and depicted in FIGS. 4–11 may be repeated multiple times in order to form the desired number of interconnects. Once the desired number of interconnects are formed, the substrate, with the copper interconnect and the dielectric, are all sintered at an appropriate temperature ambient so that the dopant in the copper alloy is driven to be evenly distributed to all of the copper interconnect surfaces to form a self passivation layer.

The present invention has been described with respect to the example of forming a dual damascene structure. However, the invention is also advantageous for other conductive layered structures.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A semiconductor device comprising a layered conductive structure comprising:
   a first insulating layer consisting of a self-copper diffusion barrier material on an underlying substrate;
   an etch stop layer having an upper surface overlying the first insulating layer;
   an opening formed in the etch stop layer and the first insulating layer filled with copper to form a via;
   a patterned copper wiring connected to the via and extending along the upper surface of the etch stop layer; and
   a second insulating layer overlying the etch stop layer and the copper wiring.

2. The semiconductor device of claim 1, wherein the first insulating layer comprises benzocyclobutene.

3. The semiconductor device of claim 1, wherein the second insulating layer comprises benzocyclobutene.

4. The semiconductor device of claim 1, wherein the copper via and wiring further comprise a seed layer comprising copper or a copper alloy.

5. The semiconductor device of claim 4, wherein the seed layer is selected from the following group: 1% Al—Cu, 1% Mg—Cu, 1% Sn—Cu and Cu.

6. The semiconductor device of claim 4, wherein the seed layer comprises a sandwiched layer of a refractory metal or refractory metal nitride layer and a copper deposition seed layer.

7. The semiconductor device of claim 6, wherein the refractory metal or refractory metal nitride is selected from the group consisting of Ta, TaN, TiN, W and WN.

8. A semiconductor device comprising a copper wiring and a copper via on a substrate formed by a method comprising the steps of:
   depositing a first insulating layer consisting of a self-copper diffusion barrier material over the substrate and an etch stop layer over the first insulating layer;
   forming and patterning a via mask layer on the etch stop layer, the via mask layer having a via mask layer opening above the location of a desired via opening;
   etching through the via mask layer to remove the etch stop layer and the first insulating layer to create the via opening;
   depositing a seed layer in the via opening;
   depositing and patterning a conductive wiring mask layer over the first insulating layer such that an opening in the conductive wiring mask layer is provided over the via opening, wherein the conductive wiring mask layer consists of a photoresistive material;
   depositing copper in the via opening and in the conductive wiring mask layer opening to form the wiring and the via;

removing the conductive wiring mask layer; and depositing a second insulating layer on the first insulating layer and around the conductive wiring.

9. The semiconductor device of claim 8, wherein the first insulating layer comprises benzocyclobutene.

10. The semiconductor device of claim 8, wherein the second insulating layer comprises benzocyclobutene.

11. The semiconductor device of claim 8, wherein exposed portions of the seed layer are removed after removing the conductive wiring mask layer and prior to depositing the second insulating layer.

12. The semiconductor device of claim 8, wherein the seed layer comprises copper or a copper alloy.

13. The semiconductor device of claim 12, wherein the seed layer is selected from the following group: 1% Al—Cu, 1% Mg—Cu, 1% Sn—Cu and Cu.

14. The semiconductor device of claim 12, wherein the seed layer comprises a sandwiched layer of a refractory metal or refractory metal nitride layer and a copper deposition seed layer.

15. The semiconductor device of claim 14, wherein the refractory metal or refractory metal nitride is selected from the group consisting of Ta, TaN, TiN, W and WN.

16. A semiconductor device comprising a copper wiring and a copper via on a substrate formed by a method comprising the steps of:

depositing a barrier layer on the substrate;

depositing a first insulating layer consisting of a self-copper diffusion barrier material over the barrier layer and an etch stop layer over the first insulating layer;

depositing and patterning a conductive wiring mask layer over the etch stop layer such that an opening in the conductive wiring mask layer is provided, wherein the conductive wiring mask layer consists of a photoresistive material;

etching through the mask opening to remove the etch stop layer, first insulating layer, and barrier layer to create a via opening;

depositing copper in the via opening and in the conductive wiring mask layer opening to form the wiring and the via;

removing the conductive wiring mask layer; and depositing a second insulating layer on the first insulating layer and around the conductive wiring.

17. The semiconductor device of claim 16, wherein the first insulating layer comprises benzocyclobutene.

18. The semiconductor device of claim 16, wherein the second insulating layer comprises benzocyclobutene.

19. The semiconductor device of claim 16, wherein exposed portions of the seed layer are removed after removing the conductive wiring mask layer and prior to depositing the second insulating layer.

20. The semiconductor device of claim 16, wherein the seed layer comprises copper or a copper alloy.

* * * * *